(12) United States Patent
Johnson et al.

(10) Patent No.: US 10,057,980 B2
(45) Date of Patent: Aug. 21, 2018

(54) METHOD AND APPARATUS FOR REDUCING CORROSION IN FLAT FLEXIBLE CABLES AND FLEXIBLE PRINTED CIRCUITS

(71) Applicant: Cisco Technology, Inc., San Jose, CA (US)

(72) Inventors: Eric Nels Johnson, Austin, TX (US); Richard Carlyle Campbell, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 52 days.

(21) Appl. No.: 15/070,838

(22) Filed: Mar. 15, 2016

(65) Prior Publication Data

US 2017/0273170 A1    Sep. 21, 2017

(51) Int. Cl.
| | | |
|---|---|---|
| *H05K 1/00* | (2006.01) | |
| *H05K 1/02* | (2006.01) | |
| *H05K 1/11* | (2006.01) | |
| *H05K 1/09* | (2006.01) | |
| *H05K 3/00* | (2006.01) | |
| *H05K 3/40* | (2006.01) | |

(52) U.S. Cl.
CPC .............. *H05K 1/028* (2013.01); *H05K 1/09* (2013.01); *H05K 1/111* (2013.01); *H05K 3/0044* (2013.01); *H05K 3/4007* (2013.01)

(58) Field of Classification Search
CPC .......... H05K 1/028; H05K 1/111; H05K 1/09; H05K 3/0044; H05K 3/4007

USPC .................. 174/117 F, 117 FF, 254
See application file for complete search history.

(56) References Cited

U.S. PATENT DOCUMENTS

| | | | | |
|---|---|---|---|---|
| 3,818,117 A | * | 6/1974 | Reyner, II ............ | H01B 7/0838 174/117 FF |
| 4,748,293 A | * | 5/1988 | Kikuchi ............... | H01B 7/0838 174/115 |
| 6,234,807 B1 | * | 5/2001 | Amini .................... | H05K 1/117 439/59 |
| 6,299,469 B1 | * | 10/2001 | Glovatsky ................ | F02D 9/02 439/329 |
| 7,021,970 B2 | | 4/2006 | Ozal | |
| 7,455,531 B2 | * | 11/2008 | Hirabayashi ......... | H01R 13/025 174/154 |
| 8,662,640 B2 | | 3/2014 | Ciminelli | |
| 2005/0190006 A1 | * | 9/2005 | Noda ........................ | H01P 3/08 333/1 |
| 2009/0193646 A1 | * | 8/2009 | Wu .......................... | H04B 1/08 29/602.1 |

(Continued)

*Primary Examiner* — Sherman Ng
(74) *Attorney, Agent, or Firm* — P. Su

(57) ABSTRACT

According to one aspect, an apparatus includes a substrate, a conductor, and a contact pad. The substrate has a first edge, and the conductor is formed on the substrate. The contact pad has a first end and a second end, and is formed on the substrate and connected to the conductor at the first end. The contact pad has a non-uniform configuration, the non-uniform configuration including a first width and a second width, the first width and the second width being measured with respect to a common axis, the first width being wider than a second width, the second width being a width of the contact pad at the second end, the second end being coincident with the first edge.

19 Claims, 9 Drawing Sheets

(56) References Cited

U.S. PATENT DOCUMENTS

| | | | |
|---|---|---|---|
| 2011/0102729 A1* | 5/2011 | Kawamura | H05K 3/0052 349/158 |
| 2012/0305294 A1* | 12/2012 | Takaura | H05K 1/117 174/254 |
| 2013/0093532 A1* | 4/2013 | Watanabe | H05K 1/0253 333/33 |
| 2015/0029636 A1* | 1/2015 | Lin | H05K 1/0259 361/220 |

\* cited by examiner

METHOD AND APPARATUS FOR REDUCING CORROSION IN FLAT FLEXIBLE CABLES AND FLEXIBLE PRINTED CIRCUITS

TECHNICAL FIELD

The disclosure relates generally to printed circuit board (PCB) and interconnect assemblies. More particularly, the disclosure relates to reducing the susceptibility of flat flexible circuits (FFCs) and flexible printed circuits (FPCs) to creep corrosion.

BACKGROUND

Flat flexible cables (FFCs) and flexible printed circuits (FPCs) are often used to provide electrical connectivity in electro-mechanical assemblies. Manufacturing processes associated with fabricating FFCs and FPCs are such that the FFCs and FPCs may be vulnerable to certain types of corrosion.

FFCs and FPCs generally include cut edges which have exposed copper. When a process used to manufacture FFCs and FPCs result in bare copper exposed to the atmosphere, sulfur and other corrosive elements in the atmosphere may react with the exposed copper. As a result, sulfur corrosion, and/or creep corrosion may occur. Such corrosion may cause electrical shorts and/or electrical opens, which may impair the performance and the lifetime of the FFCs and FPCs.

To reduce the likelihood of bare copper at cut edges of FFCs and FPCs being corroded, sealing and plating processes may be used to effectively cover the bare or exposed copper. While sealing or plating over cut copper edges may reduce the likelihood of electrical shorts and/or electrical opens, such sealing and plating processes are generally time-consuming and add cost to manufacturing.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
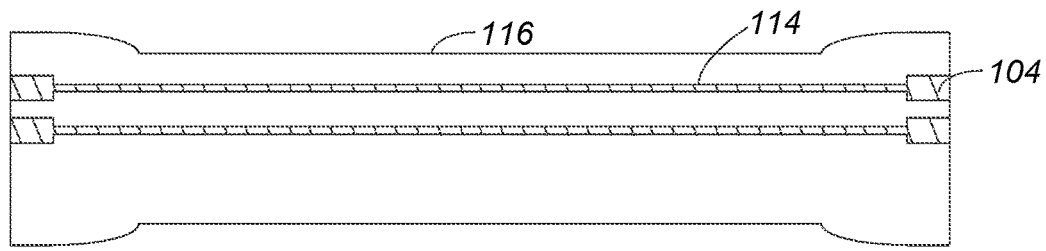
FIG. 1 is a diagrammatic representation of a flexible printed circuit (FPC).

In one embodiment, an apparatus includes a substrate, a conductor, and a contact pad. The substrate has a first edge, and the conductor is formed on the substrate. The contact pad has a first end and a second end, and is formed on the substrate and connected to the conductor at the first end. The contact pad has a non-uniform configuration, the non-uniform configuration including a first width and a second width, the first width and the second width being measured with respect to a common axis, the first width being wider than a second width, the second width being a width of the contact pad at the second end, the second end being coincident with the first edge.

Description

Flat flexible cables (FFCs) and flexible printed circuits (FPCs) or, more generally, interconnect assemblies may be used to provide electrical connections in electro-mechanical assemblies. During the manufacturing of FFCs and FPCs, copper may be exposed to the environment. For example, after sheets of FFCs or assemblies of FPCs are manufactured, and contact pads on the sheets or assemblies are plated with gold, a subsequent cutting process used to form individual FFCs or FPCs exposes copper in the contact pads that underlies the gold plating. As a result, corrosion such as creep corrosion may occur due to exposing copper to sulfur or other corrosive elements in the environment may impair the performance of FFCs and FPCs and, further, reduce the lifetime of the FFCs and FPCs. Corrosion growth may create an undesired electrical connection between adjacent contact pads.

In one embodiment, to reduce the amount of exposed copper in an FFC or FPC, contact pads on the FFC or FPC may be shaped to substantially minimize the dimensions of the contact pads at cut edges of the FFC or FPC. The implementation of contact pads which not uniform in shape, as for example are narrower at a cut end than at an opposite end, allows the amount of exposed copper in the contact pads to be reduced, without significantly compromising the integrity of the contact pads. As a result, the amount of corrosion such as creep corrosion may be reduced and, hence, the likelihood that undesired electrical connections may be formed between adjacent contact pads may be reduced. Further, standard manufacturing processes for FFCs or FPCs may remain substantially unchanged, and substantially no additional cost may be incurred, while reducing the susceptibility of the FFCs or FPCs to corrosion such as creep corrosion.

A tapered or graduated contact pad is generally a contact pad which is narrower at a cut end than at an opposite end, e.g., the end that is coupled to a conductor. In other words, a contact pad arranged to substantially minimize the amount of exposed copper after a cutting process substantially without significantly compromising the amount of "contact" area associated with the contact pad has a smaller width at a cut end than at an end coupled to a conductor. As will be discussed below, a tapered or graduated contact pad may gradually narrow or diminish in one dimension, or the tapered or graduated contact pad may have transition areas at which one dimension decreases or diminishes. In other words, a contact pad may have a substantially non-rectangular shape which has a reduced cross-sectional area at an exposed end, e.g., a cut end which is located at an edge of a FFC or FPC.

Referring initially to FIG. 1, a FPC with standard contact pads will be described. A FPC 100 includes a substrate 116 on which conductors 114 and contact pads 104 may be formed. Contact pads 104 are typically rectangularly shaped, as shown, and are arranged to interface with connectors. It should be appreciated that in some instances, contact pads 104 may be arranged to be soldered substantially directly to a printed circuit board (PCB) or other electronic device.

Figure 2:
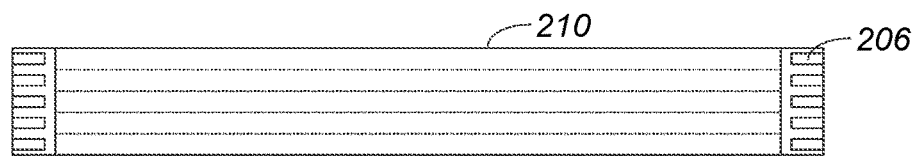
FIG. 2 is a diagrammatic representation of a flat flexible cable (FFC).

FIG. 2 is a diagrammatic representation of a standard FFC. A FFC 202 includes a flexible cable 210 and contact pads 206. Contact pads 206, as shown, are generally rectangularly shaped, and are arranged to interface with connectors.

Contact pads on standard FPCs and FFCs have a uniform width, as shown in FIGS. 1 and 2. Contact pads which have tapered or graduated widths, e.g., widths that vary from one end of the contact pad to the other, have non-uniform widths and, thus, may be configured such that a width of a contact pad at a cut end, or edge, of a FPC or FFC is narrower than a width of an opposite end of the contact pad. As a result, corrosion associated with the cut end of a contact pad may be reduced, as the exposed amount of copper of the contact pad is reduced.

Figure 3A:
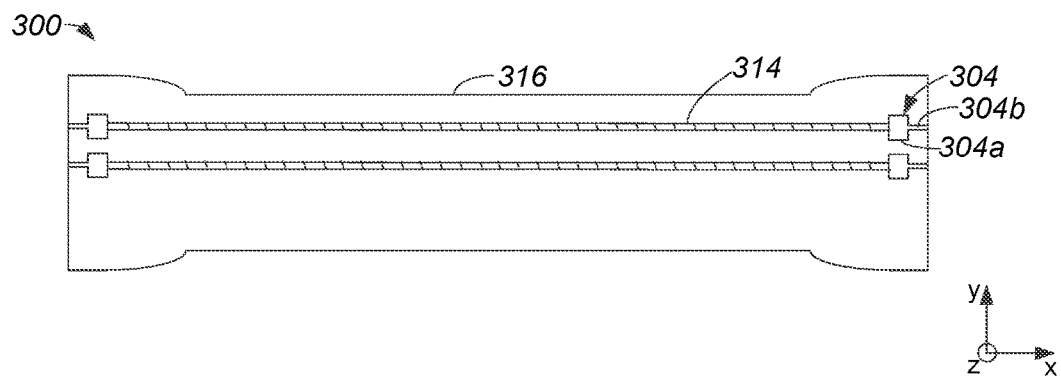
FIG. 3A is a diagrammatic top-view representation of a FPC with a tapered or graduated contact pad in accordance with an embodiment.
Figure 3B:
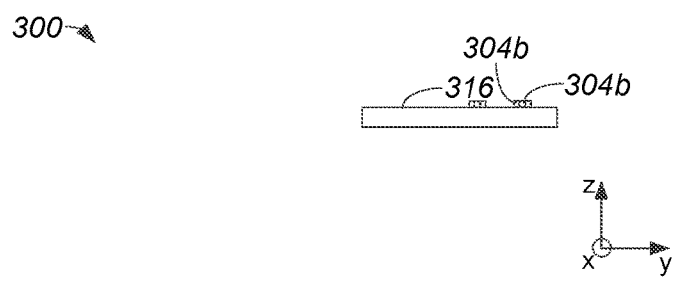
FIG. 3B is a diagrammatic side-view representation of a FPC, e.g., FPC 300 of FIG. 3A, with a tapered or graduated contact pad in accordance with an embodiment.

With reference to FIGS. 3A and 3B, a FPC with a tapered or graduated contact pad will be described in accordance with an embodiment. A FPC 300 includes a substrate 316 which includes at least one conductor 314 and at least one tapered or graduated contact pad 304.

Contact pad 304 includes a first area 304a and a second area 304b. First area 304a may generally be considered to be a first contact area of contact pad 304, which second area 304b may generally be considered to be a second contact area of contact pad 304. First area 304a generally has a width, e.g., a dimension measured with respect to a y-axis, which is larger than second area 304b. In other words, the second area 304b is narrower than first area 304a along a particular axis. Contact pad 304 is generally polygonally shaped, and includes a substantially discrete change or transition between first area 304a and second area 304b which is effectively a substantially discrete change or transition from a first width to a second width.

As first area 304b has a smaller width than second area 304a relative to the y-axis, a cut end of contact pad 304 effectively has the smallest width associated with contact pad 304 in the described embodiment. As will be appreciated by those skilled in the art, a cut end of contact pad 304 is generally located at edges of substrate 316 relative to an x-axis.

FPC 300 is generally formed as part of a manufacturing assembly or construct, e.g., a substrate assembly that includes multiple FPCs (not shown). That is, FPC 300 may generally be included as part of a fabrication sheet of FPCs (not shown) that may then be processed, as for example cut, to create separate FPCs including FPC 300.

Figure 4A:
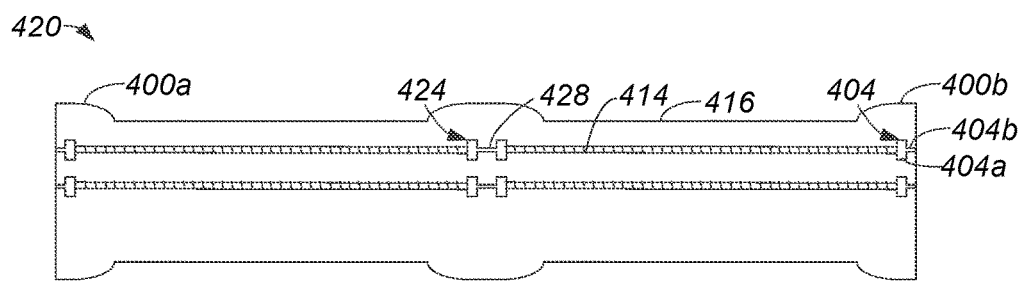
FIG. 4A is a diagrammatic representation of a FPC fabrication sheet arranged to include FPCs with tapered or graduated contact pads prior to a cutting process in accordance with an embodiment.
Figure 4B:
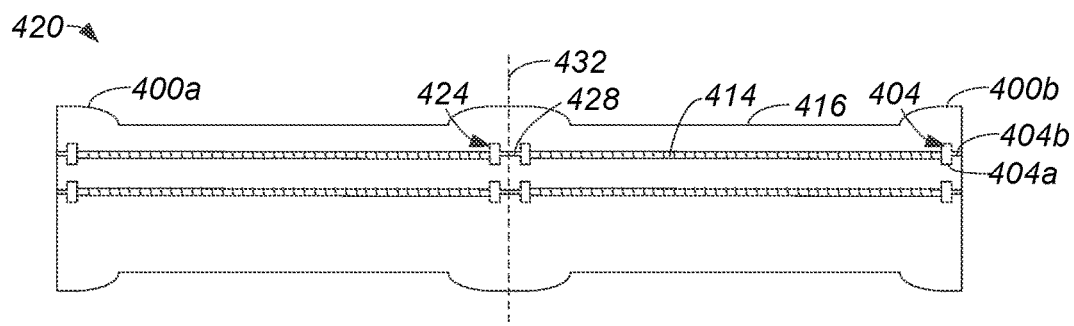
FIG. 4B is a diagrammatic representation of a FPC fabrication sheet, e.g., fabrication sheet 420 of FIG. 4A, during a cutting process in accordance with an embodiment.
Figure 4C:
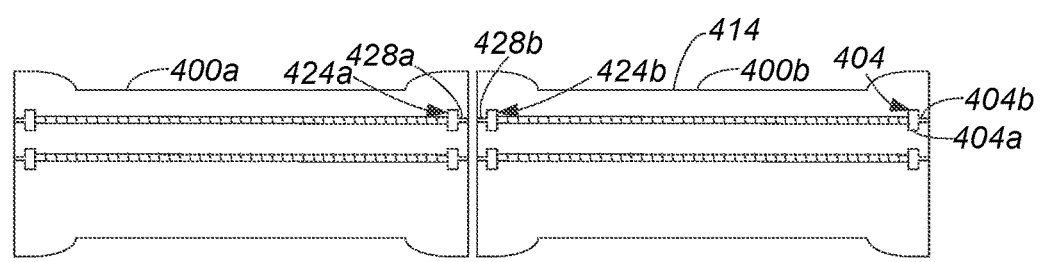
FIG. 4C is a diagrammatic representation of FPCs formed from a FPC fabrication sheet, e.g., fabrication sheet 420 of FIG. 4A, in accordance with an embodiment.

Referring next to FIGS. 4A-4C, a process of creating multiple FPCs with tapered or graduated contact pads will be described in accordance with an embodiment. FIG. 4A shows a FPC fabrication sheet arranged to define multiple FPCs with tapered or graduated contact pads at a time t1, prior to a cutting process, in accordance with an embodiment. A fabrication sheet 420 includes substrate 416 on which a first FPC 400a and a second FPC 400b are formed. It should be appreciated that while fabrication sheet 420 is shown as including two FPCs 400a, 400b, fabrication sheet 420 may generally include any number of FPCs. First FPC 400a and second FPC 400b are contiguous, or otherwise formed adjacent to one another on substrate 416, and generally include conductors 414 and contact pads 404. In the described embodiment, contact pads 404 include a first area 404a and a second area 404b, where second area 404b has a narrower width than first area 404a.

A dual contact pad arrangement 424, which includes an area 428, is configured to form separate contact pads of FPC 400a and FPC 400b upon fabrication sheet 420 being cut to substantially separate FPC 400a and FPC 400b. In one embodiment, dual contact pad arrangement 424 is arranged to form two separate tapered or graduated contact pads when cut through, or otherwise physically divided, within area 428.

At a time t2, as shown in FIG. 4B, a cut 432 may be made with respect to fabrication sheet 420. Cut 432 may be made through area 428 as shown, such that dual contact pad arrangement 424 is effectively severed, along with substrate 416.

FIG. 4C is a diagrammatic representation of separate FPCs 400a, 400b formed from fabrication sheet 420 at a time t3, after a cutting process in accordance with an embodiment. First FPC 400a and second FPC 400b are formed when area 428 is cut, and dual contact pad arrangement 424 substantially forms a first contact pad 424a that includes a narrowed area 428a, and a second contact pad 424b that includes a narrowed area 428b. As shown, first contact pad 424a and second contact pad 424b are substantially "T" shaped. First contact pad 424a is included on first FPC 400a, and second contact pad 424b is included on second FPC 400b.

Figure 5A:
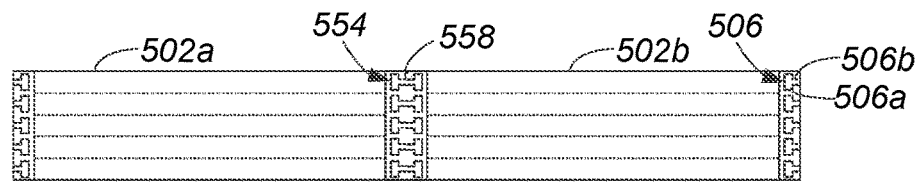
FIG. 5A is a diagrammatic representation of a FFC fabrication assembly arranged to include FFCs with tapered or graduated contact pads prior to a cutting process in accordance with an embodiment.
Figure 5B:
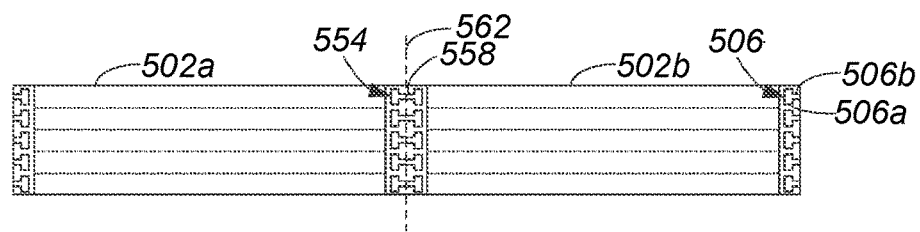
FIG. 5B is a diagrammatic representation of a FFC fabrication assembly, e.g., fabrication assembly 550 of FIG. 5A, during a cutting process in accordance with an embodiment.
Figure 5C:
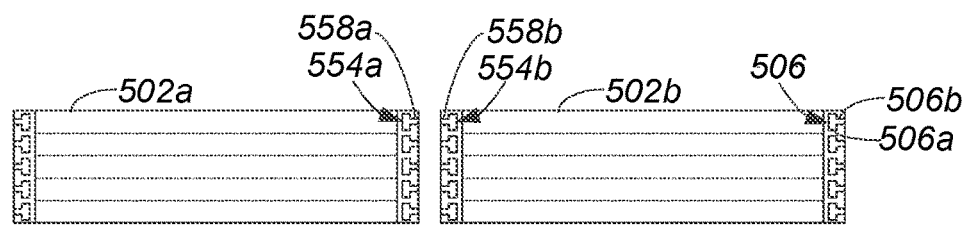
FIG. 5C is a diagrammatic representation of FFCs formed from a FFC fabrication sheet, e.g., fabrication assembly 550 of FIG. 5A, in accordance with an embodiment.

With reference to FIGS. 5A-5C, a process of creating multiple FFCs with tapered or graduated contact pads will be described in accordance with an embodiment. FIG. 5A shows a FFC fabrication assembly arranged to include multiple FFCs with tapered or graduated contact pads at a time t1, prior to a cutting process, in accordance with an embodiment. An assembly 550 includes a first FFC 502a and a second FFC 502b that are connected, or otherwise formed as a single assembly. Although assembly 550 is shown as including two FFCs 502a, 502b, assembly 550 may generally include any number of FFCs. First FFC 502a and second FPC 502b are contiguous, or otherwise formed adjacent to one another, and include contact pads 506 that each have a first area 506a and a second area 506b, where second area 506b has a narrower width than first area 506a.

A dual contact pad arrangement 554, which includes an area 558, is configured to form separate contact pads of FFC 502a and FFC 502b upon assembly 550 being cut to substantially separate FFC 502a and FPC 502b. Dual contact pad arrangement 554 is arranged to form two separate tapered or graduated contact pads when cut through, or otherwise physically divided, within area 558.

At a time t2, as shown in FIG. 5B, a cut 562 may be made with respect to assembly 550. Cut 562 may be made through area 558 as shown, such that dual contact pad arrangement 554 is effectively severed.

FIG. 5C is a diagrammatic representation of separate FFCs 502a, 502b formed from assembly 550 at a time t3, after a cutting process in accordance with an embodiment. First FFC 502a and second FFC 502b are formed when area 558 is cut, and dual contact pad arrangement 554 is cut to substantially form a first contact pad 554a that includes a narrowed area 558a, and a second contact pad 554b that includes a narrowed area 448b. First contact pad 554a is included on first FFC 502a, and second contact pad 554b is included on second FPC 502b.

As mentioned above, a tapered or graduated contact pad may gradually narrow in one dimension, or the tapered or graduated contact pad may have transition areas at which one dimension decreases. A tapered or graduated contact pad may be shaped such that the contact pad gradually tapers with respect to one dimension, e.g., a width of the contact pad may taper from a larger width at a conductor end to a smaller width at a cut end. Alternatively, a tapered or graduated contact pad may be shaped such that the contact pad has a discrete transition with respect to one dimension, e.g., a contact pad may be "T" shaped such that a wide part of the "T" is at a conductor end and a narrower part of the "T" is at a cut end.

Figure 6A:
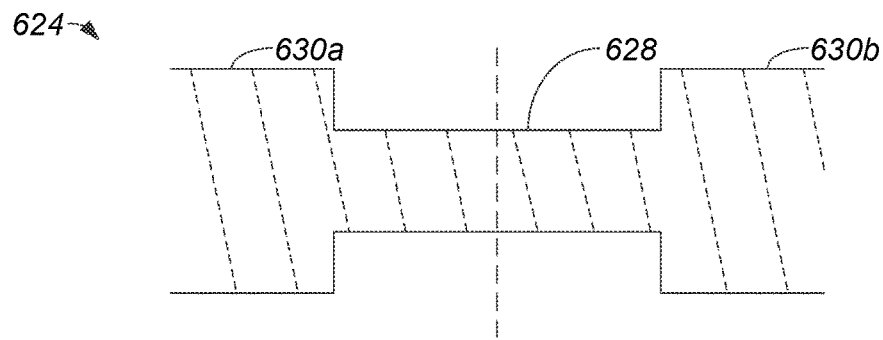
FIG. 6A is a diagrammatic representation of an arrangement arranged to created two "T" shaped contact pads prior to a cutting process in accordance with an embodiment.
Figure 6B:
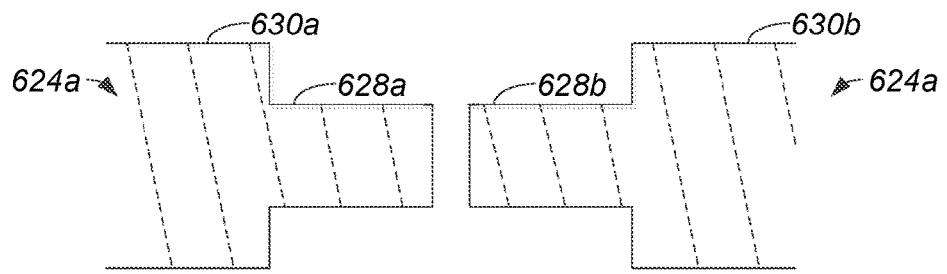
FIG. 6B is a diagrammatic representation of "T" shaped contact pads after an arrangement, e.g., arrangement 624 of FIG. 6A, is cut in accordance with an embodiment.

In one embodiment, as described above, a tapered or graduated contact pad with a discrete transition with respect to one dimension may be substantially "T" shaped. With reference to FIGS. 6A and 6B, the creation of a plurality of "T" shaped contact pads from a tapered contact pad configuration will be described. FIG. 6A is a diagrammatic representation of a tapered contact pad configuration arranged to created two "T" shaped contact pads prior to a cutting process in accordance with an embodiment. A tapered contact pad configuration 624 which may be formed on a sheet of FFCs or an assembly of FPCs generally includes first areas 630a, 630b and a second area 628. First areas 630a, 630b are configured to form contact areas of separate contacts pads, e.g., after second area 628 is divided into two portions during a cutting process. First areas 630a, 630b are generally mated to contacts on another electromechanical apparatus (not shown), and are generally engaged, or otherwise interfaced, with connectors.

FIG. 6B is a diagrammatic representation of discretely graduated "T" shaped contact pads after arrangement 624 is cut within second area 628, and the resulting "T" shaped contact pads are separated from each other in accordance with an embodiment. After arrangement 624 is cut, a first "T" shaped overall contact pad 624a and a second "T" shaped overall contact pad 624b are created. Overall contact pad 624a includes first area 630a and a portion of second area 628a, while overall contact pad 624b includes first area 630b and a portion of second area 628b. First areas 630a, 630b may generally be considered to be larger contact areas, while second areas 628a, 628b may generally be considered to be smaller contact areas. It should be appreciated that in general, when first area 630a and second area 628a are engaged with a connector (not shown), first area 630a may act as a contact pad within the connector, while second area 628a does not act as part of the contact pad, although second area 628a is effectively within the connector.

Figure 7A:
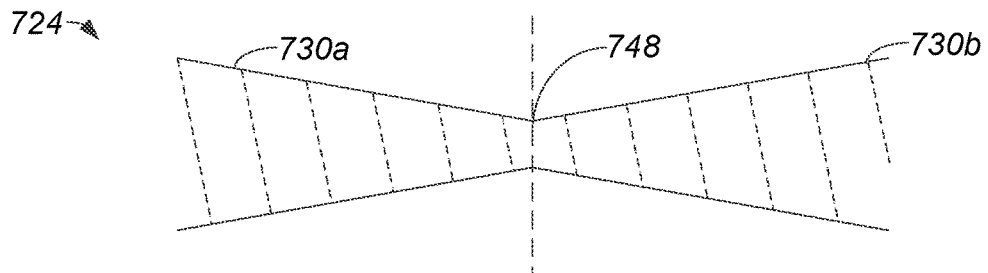
FIG. 7A is a diagrammatic representation of an arrangement arranged to created two substantially trapezoidal contact pads prior to a cutting process in accordance with an embodiment.

Tapered or graduated contact pads may have a trapezoidal shape. FIG. 7A is a diagrammatic representation of an arrangement arranged to created two substantially trapezoidal contact pads prior to a cutting process in accordance with an embodiment. A tapered contact pad configuration 724 which may be formed on a sheet of FFCs or an assembly of FPCs generally includes areas 730a, 730b and a section 748. Areas 730a, 730b are configured to form contact areas of separate contacts pads, e.g., after a cut is made at section 748 during a cutting process. Areas 730a, 730b are generally coupled to conductors (not shown) at ends away from section 748, and are generally engaged to interface with connectors.

Figure 7B:
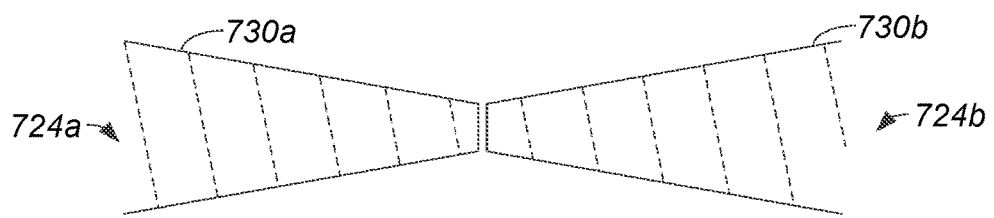
FIG. 7B is a diagrammatic representation of trapezoidal contact pads after an arrangement, e.g., arrangement 724 of FIG. 7A, is cut in accordance with an embodiment.

FIG. 7B is a diagrammatic representation of trapezoidal contact pads which result after arrangement 724 is cut at section 748 and the resulting trapezoidal contact pads are separated from each other in accordance with an embodiment. A first trapezoidal contact pad 724a is formed to include area 730a, while a second trapezoidal contact pad 724b is formed to include area 730b. Trapezoidal contact pads 724a, 74b are such that a short end of the trapezoids is effectively be formed by cutting arrangement 724 at section 748, where a long end of the trapezoids is at an opposite end from the short end of the trapezoids.

Figure 8:
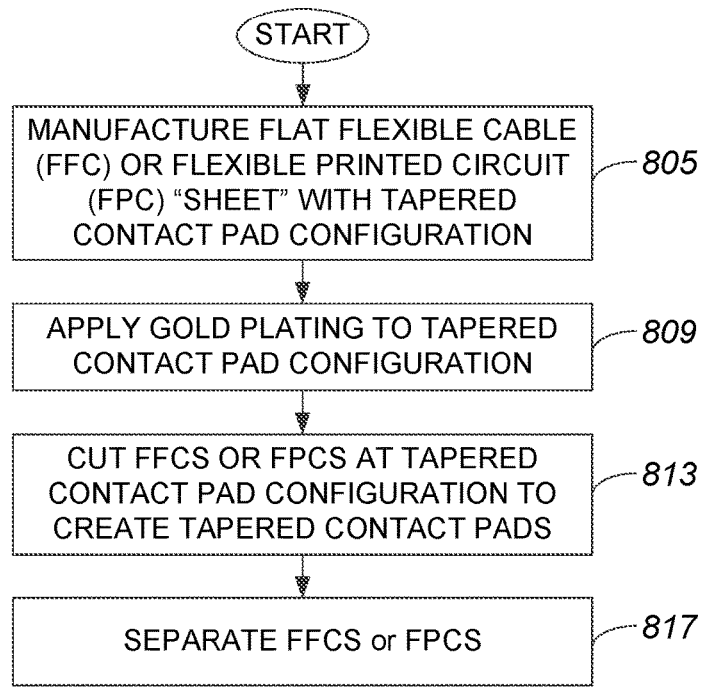
FIG. 8 is a process flow diagram which illustrates one method of creating FFCs or FPCs with tapered or graduated contact pads in accordance with an embodiment.

FIG. 8 is a process flow diagram which illustrates one method of creating FFCs or FPCs with tapered or graduated contact pads in accordance with an embodiment. A method 801 of creating FFCs or FPCs with tapered or graduated contact pads begins at step 805 in which a sheet of FFCs, or an assembly of FPCs, is manufactured. It should be appreciated that any suitable FFC or FPC manufacturing process may be used to create the sheet of FFC or the assembly of FPCs. The sheet of FFCs or the assembly of FPCs includes at least one tapered contact pad configuration formed from copper. A tapered contact pad configuration is arranged such that, when cut, the tapered contact pad configuration forms two separate tapered or graduated contact pads associated with flexible assemblies, e.g., an FFC or an FPC, defined in the sheet of FFCs or the assembly of FPCs.

In step 809, tapered contact pad configurations are plated with gold using any suitable gold plating process. That is, the copper tapered contact pad configurations on the sheet of FFCs or assembly of FPCs is plated with gold. Once the tapered contact pad configurations are placed with gold, the sheet of FFCs or the assembly of FPCs is cut at the tapered contact pad configuration to form separate FFCs or FPCs which each include a tapered or graduated contact pad in step 813. The cutting process exposes underlying copper in the contact pads. However, the geometry of the contact pads is such that the cut ends of the contact pads have a smaller area than the opposite ends of the contact pads and, hence, creep corrosion associated with exposed copper may be substantially reduced. After the cutting process, the FFCs or FPCs may be separated. Upon separating the FFCs or FPCs, the method of creating FFCs or FPCs is completed.

Figure 9:
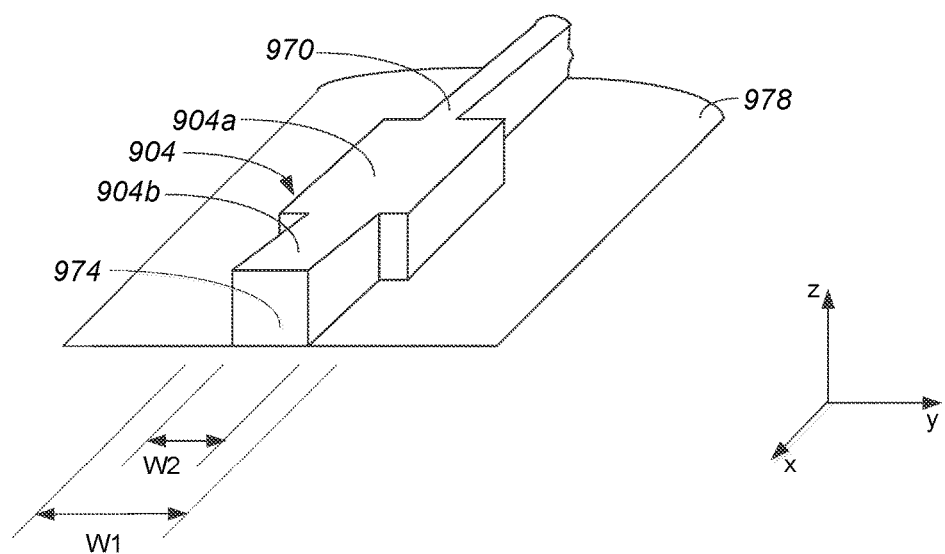
FIG. 9 is a diagrammatic three-dimensional representation of a contact pad in accordance with an embodiment.

The width of a cut end of a contact pad relative to the width of an opposite end of a contact pad may vary widely. FIG. 9 is a diagrammatic three-dimensional representation of a contact pad, as shown on a flexible assembly such as a FFC or FPC, in accordance with an embodiment. It should be appreciated that FIG. 9 is not drawn to scale. A FFC or FPC 900 includes a substrate 978 on which at least one tapered or graduated overall contact pad 904 and at least one conductor 970 is formed. Overall contact pad 904 is generally gold plated on its exposed surfaces with respect to an xz-plane, with underlying copper.

A width of larger contact area 904a or, more generally, overall contact pad 904, relative to a y-axis, e.g., at an end that is substantially directly coupled to conductor 970, is expressed as a width W1. A width of a smaller contact area 904b, or an area of reduced width, relative to the y-axis is expressed as width W2. That is, width W2 and width W1 are measured with respect to a common axis. It should be appreciated that width W2 is effectively the width of a cut end 974 of contact pad 904, and that cut end 974 is typically coincident with an edge of substrate 978. In the described embodiment, surfaces of contact pad 904 are substantially all gold plated, with the exception of cut end 974, which is typically copper, e.g., exposed copper.

In general, width W1 is greater than width W2. That is, a ratio of width W1 to width W2 is greater than one. The values of width W1 and width W2 may vary widely. By way of example, the ratio of width W1 to width W2 may be in the range of approximately 1.1 to approximately 8.0. In one embodiment, the ratio of width W1 to width W2 may be approximately 5.6 or approximately 7.0. Width W1 may generally be any suitable width, or any suitable pitch, associated with standards FFCs and FPCs. For example, width W2 may be between approximately 0.10 millimeter (mm) and approximately 1.0 mm. In one embodiment, width W2 may vary between approximately 0.13 mm to approximately 0.71 mm, while width W1 may generally be greater than approximately 0.13 mm when W2 is approximately 0.13 mm, or width W1 may be greater than approximately 0.71 mm when W2 is approximately 0.71 mm. In another embodiment, width W2 may vary between approximately 0.005 in to approximately 0.028 in, while width W1 may generally be greater than approximately 0.005 in when W2 is approximately 0.005 in, or width W1 may be greater than approximately 0.028 in when W2 is approximately 0.028 in. Width W2 may be any suitable value that is less than a corresponding value of width W1.

A dimension of larger contact area 904a relative to a z-axis and a dimension of smaller contact area 904 relative to the z-axis may be substantially the same. Thus, the cross-sectional area of larger contact area 904a in a yz-plane is typically larger than the cross-sectional area of smaller contact area 904b in the yz-plane.

Although only a few embodiments have been described in this disclosure, it should be understood that the disclosure may be embodied in many other specific forms without departing from the spirit or the scope of the present disclosure. By way of example, in addition to, or in lieu of, a width of a contact pad being reduced at a cut end of the contact pad in order to substantially minimize corrosion, a depth of the contact pad may be reduced at a cut end. Reducing the depth of a contact pad, as for example with respect to a z-axis as shown in FIG. 9, at a cut end of the contact pad may also serve to reduce corrosion by reducing the amount of exposed copper at the cut end of the contact pad.

A FPC fabrication sheet and a FFC fabrication assembly have generally been described as including more than one FPC and more than one FFC, respectively. It should be appreciated that a FPC fabrication sheet may include a single FPC, and a FFC fabrication assembly may be include a single FFC. When an FPC fabrication sheet includes a single FPC, for example, contact pads may be formed with end portions for an electroplating process, and the end portions may be cut off and discarded such that contact pads in accordance with the disclosure are formed.

In general, the shape of a non-uniform, e.g., tapered or graduated, contact pad formed on a flexible assembly may vary. As previously discussed, a contact pad may be generally "T" shaped or a contact pad may have a generally trapezoidal or triangular shape. Other suitable shapes of a tapered or graduated contact pad may include, but are not limited to including, various polygonal shapes and ovular shapes. Polygonal shapes may include substantially diamond shapes and other shapes which provide for a smaller width at a cut end of a contact pad than at other portions of the contact pad.

The width of a cut end of a tapered or graduated contact pad is generally smaller than the width of an opposite end of the contact pad, e.g., the end of the contact pad which is substantially directly coupled to a conductor. The dimensions associated with a tapered or graduated contact pad may vary widely and may depend upon factors including, but not limited to including, center-to-center distance requirement for adjacent contact pads. In addition to a ratio of the width of the cut end to the width of an opposite end varying depending upon, for example, spacing requirements of an FPC or an FFC, other dimensions associated with the contact pad may also vary widely.

Any suitable apparatus may be used to create tapered or graduated contact pads on FFCs and FPCs. That is, substantially any suitable fabrication apparatus, e.g., an apparatus which is configured to apply photoresist and to implement etching, may be used to create FFCs and FPCs in accordance with the disclosure.

While the use of tapered or graduated contact pads has been described in terms of use with respect to a FFC or a FPC, it should be appreciated that the use of tapered or graduated contact pads in accordance with the disclosure is not limited to use with a FFC or a FPC. Tapered or graduated contact pads may be used with respect to any suitable cable or circuit arrangement.

The steps associated with the methods of the present disclosure may vary widely. Steps may be added, removed, altered, combined, and reordered without departing from the spirit of the scope of the present disclosure. Therefore, the present examples are to be considered as illustrative and not restrictive, and the examples is not to be limited to the details given herein, but may be modified within the scope of the appended claims.

What is claimed is:

1. An apparatus comprising:
a substrate, the substrate having a first edge;
a plurality of conductors, the plurality of conductors each being formed on the substrate; and
a plurality of contact pads, each contact pad of the plurality of contact pads having a first end and a second end, each contact pad of the plurality of contact pads being formed on the substrate and connected to a corresponding conductor of the plurality of conductors at the first end, wherein each contact pad of the plurality of contact pads has a non-uniform configuration, the non-uniform configuration including a first width and a second width, the first width and the second width being measured with respect to a common axis, the first width being wider than a second width, the second width being a width of the contact pad at the second end, the second end being coincident with the first edge, wherein the second width is a smallest width of each contact pad of the plurality of contact pads.

2. The apparatus of claim 1 wherein the first width is the width of each contact pad of the plurality of contact pads at the first end, and wherein of each contact pad of the plurality of contact pads has at least one discrete transition from the first width to the second width, each contact pad of the plurality of contact pads having a T shape.

3. The apparatus of claim 1 wherein the first width is the width of each contact pad of the plurality of contact pads at the first end, and wherein each contact pad of the plurality of contact pads tapers from the first width to the second width.

4. The apparatus of claim 1 wherein the second end is an exposed end of each contact pad of the plurality of contact pads, the exposed end being coincident with the first edge.

5. The apparatus of claim 4 wherein the exposed end includes exposed copper.

6. The apparatus of claim 5 wherein the exposed copper is exposed as a result of a cutting process, and wherein each contact pad of the plurality of contact pads is gold plated except for the exposed copper.

7. The apparatus of claim 1 wherein the apparatus is one selected from a group including a flat flexible cable (FFC) and a flexible printed circuit (FPC).

8. The apparatus of claim 2 wherein each contact pad of the plurality of contacts pads is of a T shape such that a wide part of the T shape has the first width and a narrower part of the T shape has the second width.

9. The apparatus of claim 8 wherein the wide part has a first area and the narrower part has a second area, the first area being larger than the second area.

10. An apparatus comprising:
a substrate, the substrate having a first edge;
a plurality of conductors, the plurality of conductors each being formed on the substrate; and
a plurality of contact pads, each contact pad of the plurality of contacts pads having a first portion and a second portion, each contact pad of the plurality of contacts pads formed on the substrate and connected to a corresponding conductor of the plurality of conductors at the first portion, the second portion including an end that is coincident with the first edge, the first portion having a first width relative to an axis, the second portion having a second width relative to the axis, wherein the first width is greater than the second width and wherein there is a discrete transition in the contact pad from the first width to the second width, and wherein each contact pad of the plurality of contacts pads is gold plated with the exception of the end, wherein the end is exposed copper.

11. The apparatus of claim 10 wherein the copper is exposed as a result of a cutting process.

12. The apparatus of claim 10 wherein a ratio of the first width to the second width is between approximately 1.1 and approximately 8.0.

13. The apparatus of claim 10 wherein the apparatus is one selected from a group including a flat flexible cable (FFC) and a flexible printed circuit (FPC).

14. The apparatus of claim 10 wherein each contact pad of the plurality of contacts pads is of a T shape such that a wide part of the T shape is the first portion and a narrower part of the T shape is the second portion.

15. The apparatus of claim 14 wherein the first portion has a first area and the second portion has a second area, the first area being larger than the second area.

16. The apparatus of claim 15 wherein the apparatus is a flat flexible cable (FFC).

17. An apparatus comprising:
a substrate, the substrate having a first edge;
a plurality of conductors, the plurality of conductors each being formed on the substrate; and
a plurality of contact pads, each contact pad of the plurality of contacts pads having a first end and a second end, each contact pad of the plurality of contacts pads being formed on the substrate and connected to a corresponding conductor at the first end, wherein each contact pad of the plurality of contacts pads has a non-uniform configuration, the non-uniform configuration being a tapered configuration including a first width and a second width wherein each contact pad of the plurality of contacts pads gradually narrows from the first width to the second width, the first width and the second width being measured with respect to a common axis, the first width being wider than a second width, the second width being a width of each contact pad of the plurality of contacts pads at the second end, the second end being coincident with the first edge, wherein the second width is a smallest width of each contact pad of the plurality of contact pads.

18. The apparatus of claim 17 wherein the non-uniform configuration is a trapezoidally-shaped configuration.

19. The apparatus of claim 17 wherein the apparatus is a flat flexible cable (FFC).

* * * * *